United States Patent
Downey

(10) Patent No.: US 10,135,467 B2
(45) Date of Patent: Nov. 20, 2018

(54) METHODS AND SYSTEMS FOR APPLYING AN IMPROVED INTERLEAVER FOR MODEMS OPERATING ON POWER GRID

(71) Applicant: Echelon Corporation, San Jose, CA (US)

(72) Inventor: Walter Downey, San Jose, CA (US)

(73) Assignee: Echelon Corporation, Santa Clara, CA (US)

( * ) Notice: Subject to any disclaimer, the term of this patent is extended or adjusted under 35 U.S.C. 154(b) by 0 days.

(21) Appl. No.: 15/176,979

(22) Filed: Jun. 8, 2016

(65) Prior Publication Data

US 2017/0359149 A1 Dec. 14, 2017

(51) Int. Cl.
*H03M 13/27* (2006.01)
*H04L 1/00* (2006.01)

(52) U.S. Cl.
CPC ... *H03M 13/2792* (2013.01); *H03M 13/2789* (2013.01); *H04L 1/0041* (2013.01); *H04L 1/0071* (2013.01)

(58) Field of Classification Search
CPC .......... H03M 13/2792; H03M 13/2789; H04L 1/0071
See application file for complete search history.

(56) References Cited

U.S. PATENT DOCUMENTS

| | | | | |
|---|---|---|---|---|
| 5,559,377 A | * | 9/1996 | Abraham | H04B 3/56 307/104 |
| 2006/0062314 A1 | * | 3/2006 | Palin | H04L 27/2626 375/260 |
| 2008/0086674 A1 | | 4/2008 | Shen et al. | |
| 2008/0091986 A1 | * | 4/2008 | Nimbalker | H03M 13/275 714/701 |
| 2008/0104478 A1 | * | 5/2008 | Oz | H03M 13/2775 714/755 |
| 2008/0133998 A1 | * | 6/2008 | Nimbalker | H03M 13/275 714/755 |
| 2010/0169738 A1 | | 7/2010 | Wu et al. | |
| 2011/0280261 A1 | | 11/2011 | Varadarajan et al. | |
| 2012/0236763 A1 | | 9/2012 | Lucani et al. | |
| 2014/0269874 A1 | | 9/2014 | Afkhami et al. | |

OTHER PUBLICATIONS

International Search Report and Written Opinion for Application No. PCT/US2017/036610, dated Sep. 14, 2017, 11 pages.

* cited by examiner

*Primary Examiner* — Joseph D Torres
(74) *Attorney, Agent, or Firm* — Nicholson De Vos Webster & Elliott LLP

(57) ABSTRACT

Methods and systems are disclosed for applying an interleaver that better distributes signal errors to be used in devices operating on low voltage power grids. One embodiment of a method comprises: determining a frequency cycle of the communication medium; setting an interleaver block size based on the frequency cycle of the communication medium; re-arranging bits in a data packet based on the interleaver block size; transmitting the re-arranged data packet over the communication medium to a receiver. Specifically, according to an embodiment, the interleaver block size is set to one-half of the frequency cycle of the communication medium.

6 Claims, 5 Drawing Sheets

METHODS AND SYSTEMS FOR APPLYING AN IMPROVED INTERLEAVER FOR MODEMS OPERATING ON POWER GRID

BACKGROUND INFORMATION

Modern modems operating on low voltage power grids use multi-carrier modulation ("MCM") techniques. These modems transmit information in symbols spread out sequentially in time and across different frequency carriers. While each individual frequency carriers may occupy a narrow bandwidth, the composite signal of the individual frequency carriers forms a broad bandwidth. Standards such as IEEE P1901.2 and ITU 9953 (G3) specify orthogonal frequency-division multiplexing ("OFDM") as the modulation technique for power grid communications. One characteristic inherent with signal transmission over a power grid is the concentration of signal errors (i.e., noise bursts) that seems to occur in certain time and/or frequency windows. When the concentration of signal errors in a contiguous region of a signal transmission is too high, the error correction techniques applied to the signal transmission, such as the use of convolutional error code, tend to perform poorly.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figures 1, 2, 3, 4:
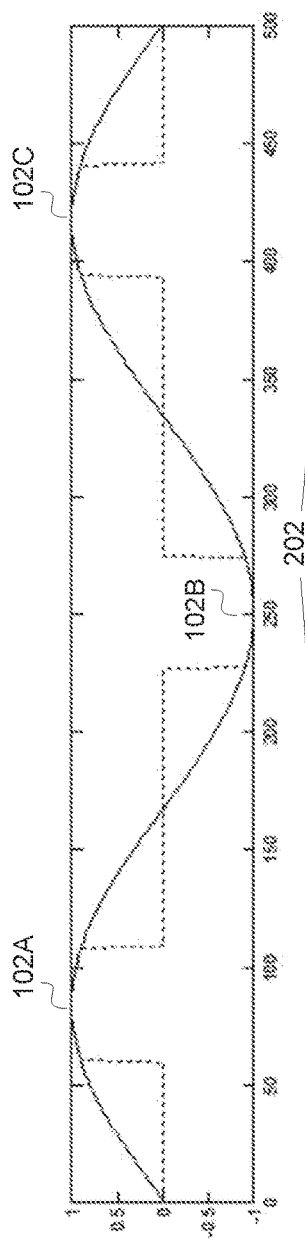
FIG. 1 illustrates an exemplary alternating current (AC) waveform.
FIG. 2 illustrates an exemplary 2-dimensional matrix representation of transmitted data bits including bit errors caused by noise bursts.
FIG. 3 illustrates an exemplary single serial vector representation of transmitted data bits including bit errors caused by noise bursts.
FIG. 4 illustrates an exemplary error density graph.

Described herein are embodiments of methods and systems for setting interleaver block size for modems operating on a communication medium prone to high noise bursts. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. For clarity, individual components in the Figures herein may be referred to by their labels in the Figures, rather than by a particular reference number.

One characteristic inherent with signal transmission over a power grid is the concentration of signal errors that tend occur in certain time and/or frequency windows. When the concentration of signal errors in a contiguous region of a signal transmission is too high, the error correction techniques applied to the signal transmission, such as the use of a convolutional error code, tend to perform poorly. To address this issue, standards, such as IEEE P1901.2 and ITU 9953 (G3), specify the use of an interleaver for lowering potential error density peaks by distributing signal errors more evenly throughout the signal transmission. Specifically, an interleaver attempts to spread signal errors over signal block sizes that grow with the number of bits. While the use of interleaver has been shown to work well with some communication mediums and channels, such as telephone wires, coaxial cables, and wireless signals, its benefits are not fully realized on other communication mediums, such as a power grid. For instance, information transmitting systems operating on power grids often avoided transmission during noisy time intervals. These systems would first determine the noisy intervals relative to the power line frequency zero crossings and then simply not transmit data during those intervals. While this technique may reduce signal errors associated with signal error peaks associated with noise bursts, it suffers from lower throughput because the noisy intervals that could have been used to send data, albeit with a higher error rate, are not being utilized. Moreover, additional hardware may be required to determine and keep track of the powerline voltage zero crossings.

Embodiments of methods and systems are described herein for selecting an interleaver interval or block size that enables modems operating on power grids to better distribute signal errors across data transmissions while eliminating the need for frequent measuring of the powerline's voltage zero crossings. Low voltage power grids contain a special class of impairments that tends to cause signal errors to be concentrated in time (i.e., bursts). However due to the special nature of these impairments, noise bursts that occur tend to be periodic and synchronized with respect to the power distribution frequency. This makes the timing interval between of the noisy bursts predictable. According to some embodiments, when setting parameters for an interleaver, rather than using the error coding block size or packet size, it is advantageous to select an interleaver block size that allows data to be distributed approximately evenly over a period that is one-half of the frequency cycle of the communication medium. In doing so, the possibility of lumping together error bits from high noise regions of different half-periods decreases. Moreover, since this interleaver block size choice is independent of the voltage zero crossing, no addition hardware is required to measure and to track the voltage zero crossing.

Most power distribution grids in the world use AC waveforms at frequencies of 50 Hz or 60 Hz. FIG. 1 is an example of such an AC voltage waveform. A typical power grid contains many devices that not only draw power from the grid, but also conduct noise back onto the grid. Such devices tend to conduct the noise in bursts centered at the peaks of the AC voltage waveform (e.g., 102A, 102B, and 102C of FIG. 1). When the power grid is used as a communication medium, modems typically divide the data into symbols of a fixed duration. These symbol times are usually small relative to the power line distribution frequency. Thus a period or a half-period of the power line frequency may contain many symbols. In addition, in MCM modems, each symbol may comprise bits from different carrier frequencies. As such, data being transmitted over a power grid can be represented as a 2-dimensional m by n matrix, where m is the number of carriers and n is the number of symbols. FIG. 2 illustrates an exemplary 2-dimensional matrix that comprises bit errors caused by noise bursts. These bit errors are represented by darkened blocks (e.g., 202 of FIG. 2). In order to decode the transmitted data, the bits are read out one bit at a time and placed into a single serial vector. From the single serial vector, such as the one illustrated in FIG. 3, it is evident that the signal errors occur near each other in adjacent symbols end up being contiguous in the linear vector, illustrated by regions 302A-C of FIG. 3. Most modern communication systems employ some form of forward error correction (FEC) that adds redundancy to the data and enables a small amount of errors that occur during transmission to be corrected. One popular type of error correction code (ECC) for performing FEC is the convolutional code. This type of code performs well (i.e., can correct many errors) when the error density does not exceed a certain threshold. However, when the error density does exceed the threshold, the convolutional code tends to get overloaded which likely results in an incorrectly decoded data stream.

FIG. 4 illustrates an error density graph obtained by plotting of the number of errors that occur for every 6 bits of received data in the serial vector of FIG. 3. It can be seen that at 402, a peak of 5 errors are present in the span of 6 bits. Such concentration of errors is problematic because the error correction code used will likely not be able to decode the data correctly, if at all. Moreover, it can be seen in FIG. 4 that there are numerous intervals in the transmission where there are no errors (i.e., the error density is 0). Such regions can be utilized to "absorb" some signal errors while still being able to be correctly decoded by the error correction code. Thus, to mitigate this peak error density problem, typical power line protocols use an interleaver to try to scramble the bits in time-frequency space over different frequencies and symbols such that related data bits are not being transmitted congruously, but rather as a shuffled bit pattern. The idea is that such interleaving of data bits would lower the chance of multiple data bits of a given symbol being affected by the noise bursts. This, in turn, increases the probability that all received symbols can be decoded correctly. The typical interleavers that are used to re-arrange data bits across time and frequency often do not take into account the time periodicity of the noise bursts. Thus, while typical interleavers are useful at reducing the peak error density to a low enough value which allows some of the errors to be corrected, the re-arrangements these typical interleavers employ are pseudo-random and not always reliable. For example, due to the pseudo-random nature of the re-arrangement, simply by chance there will be times when signal errors will occur adjacent to each other and thereby causing a high enough concentration of errors to overload the ECC code.

The re-arrangement of data bits by the interleaver is usually done in blocks that, in turn, dictates the symbol length. The size of these blocks are typically determined by factors such as the coding block size, payload size, memory size, and/or packet size that have no relation to the spacing of noise bursts. By not taking into account the spacing between noise bursts, certain symbol lengths will inevitably concentrate bursts from different half-periods into the same interval. This results in overloading some intervals with a concentration of errors higher than what the error correction coding can handle.

Figures 5, 6, 7, 8:
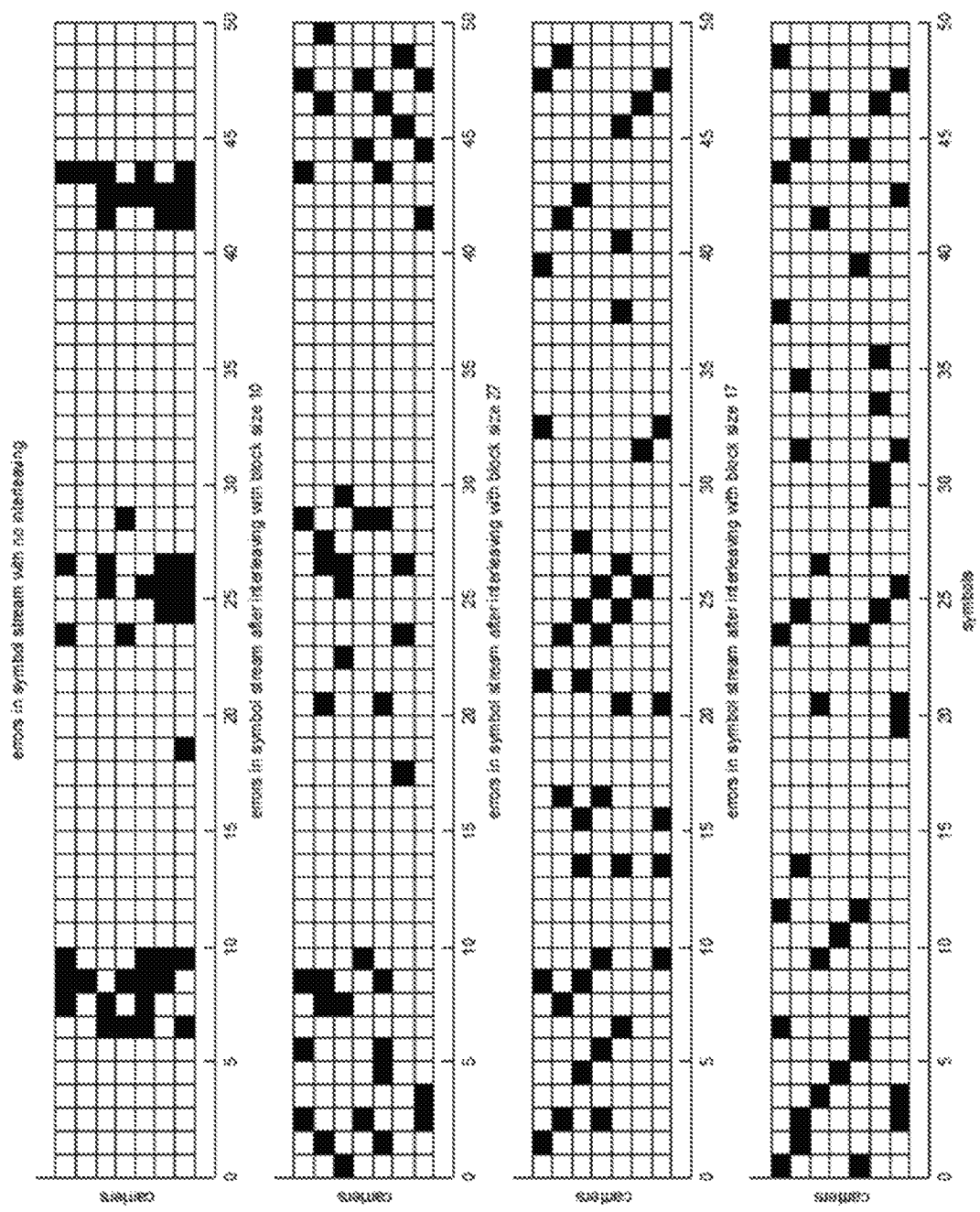
FIG. 5-8 illustrate 2-dimensional matrix representations of transmitted data bits, including bit errors caused by noise bursts, when different interleaver block sizes are used.
Figure 9:
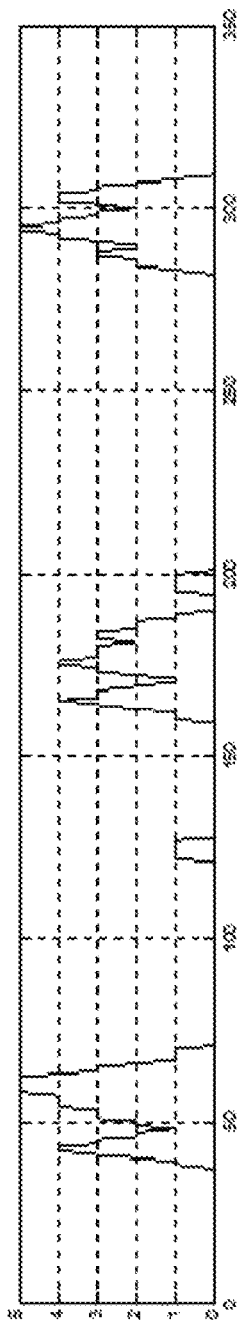
FIG. 9-12 illustrate error density graphs of the transmitted data bits when different interleaver block sizes are used.
Figure 10:
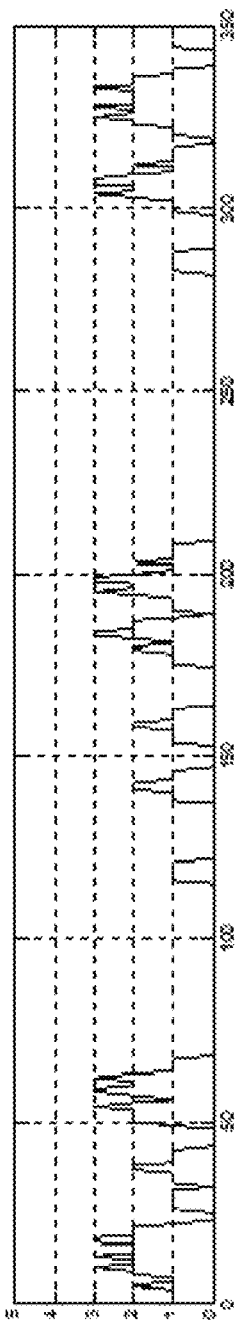
Figure 11:
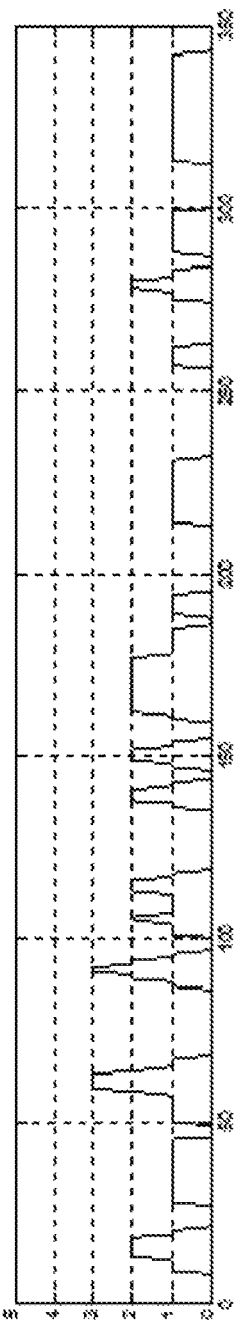
Figure 12:
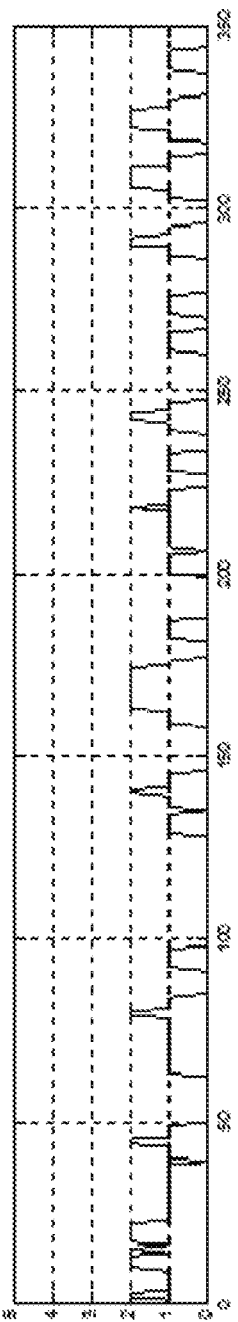

For power line modems that utilize power grid as a communication medium, it is advantageous to use, whenever possible, an interleaver block size or length that is one-half of the frequency cycle of the power line. This is because each half of a frequency cycle on the power line typically comprises a small burst of errors accompanied by large error-free intervals. If the interleaver block size or length is too small, the errors will not be spread out fully into the no-error zones. FIG. 5-8 illustrate an exemplary data packet transmitted over a power grid by a power line modem. The data packet is modulated onto 7 carriers, contains 17 symbols per half AC cycle (i.e., 34 symbols per cycle) and has experienced 3 error bursts during transmission. FIG. 5 shows the errors in the symbol stream when no interleaver is used. The corresponding error density is shown in FIG. 9. FIG. 6 shows the same data stream transmitted with an interleaver having too small a block size (length=10). Its corresponding error density is shown in FIG. 10. FIG. 7 shows the same data stream transmitted with an interleaver having too big a block size (length=27). Its corresponding error density is shown in FIG. 11. In the cases where the block size chosen for the interleaver is either too large or too small, errors from 2 half cycles are inadvertently placed next to each other which results in a higher error density than what can be achieved when a proper interleaver block size is selected. FIG. 8 illustrates the same data stream transmitted with the optimal interleaver block size that is one-half of the AC frequency cycle (i.e., 17). It is evident from the corresponding error density graph shown in FIG. 12 that when the interleaver uses a block size or length that is exactly one-half of the frequency cycle of the power grid communication medium, noise density peak is the lowest out of all possible block sizes.

Figure 13:
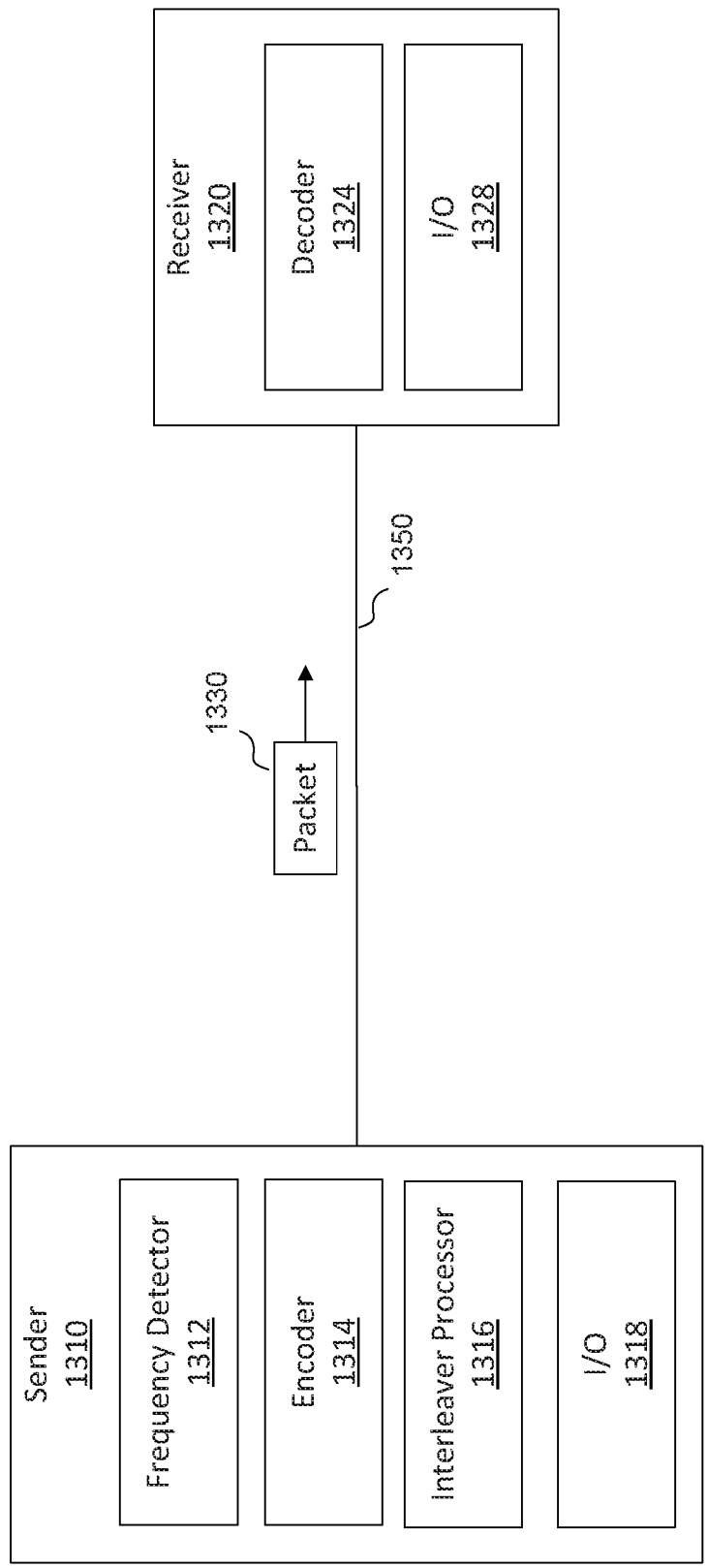
FIG. 13 is a block diagram illustrating a system for performing the interleaver error distribution in accordance with an embodiment.

FIG. 13 is a block diagram illustrating an exemplary system for performing interleaver error distribution according to an embodiment. A sender 1310 sends a packet 1330 over a communication medium 1350 and a receiver 1320 receives the packet 1330. The sender 1310 and receiver 1320 may be any device such as a modem, transceiver, router, switch, hub, etc. that can send and/or receive network packets, signals, data, etc. over a communication medium or channel. The sender 1310 and receiver 1320 are coupled by a communication medium, such as a low voltage power grid, cable, telephone line, etc., that may be prone to periodic noise bursts. In some embodiments, the sender comprises a frequency detector 1312 to detect the frequency cycle of the communication medium, an encoder 1314 to encode the packet 1330 with error correction code, and an interleaver processor 1316 to set the interleaver parameters and to perform the interleaving and/or re-arrangement of bits in packet 1330. The frequency detector 1312, encoder 1314, and interleaver processor 1316 may be implemented as hardware circuits or as software program codes stored in memory to be executed by one or more execution units in the sender. In some embodiments, a combination of hardware circuit and software program code is used to implement each of the aforementioned components. The receiver 1320 comprises a decoder 1324 to decode and perform error correction on the received packet 1330. The decoder 1324, just like the encoder 1314 in the sender, may be implemented as a hardware circuit, a software program, or a combination of both. Moreover, in accordance to an embodiment, the sender and the receiver each comprises an input/output (I/O) hardware (1318 and 1328, respectively) for transmitting and receiving packets, signals, data, etc. through the communication medium.

Figure 14:
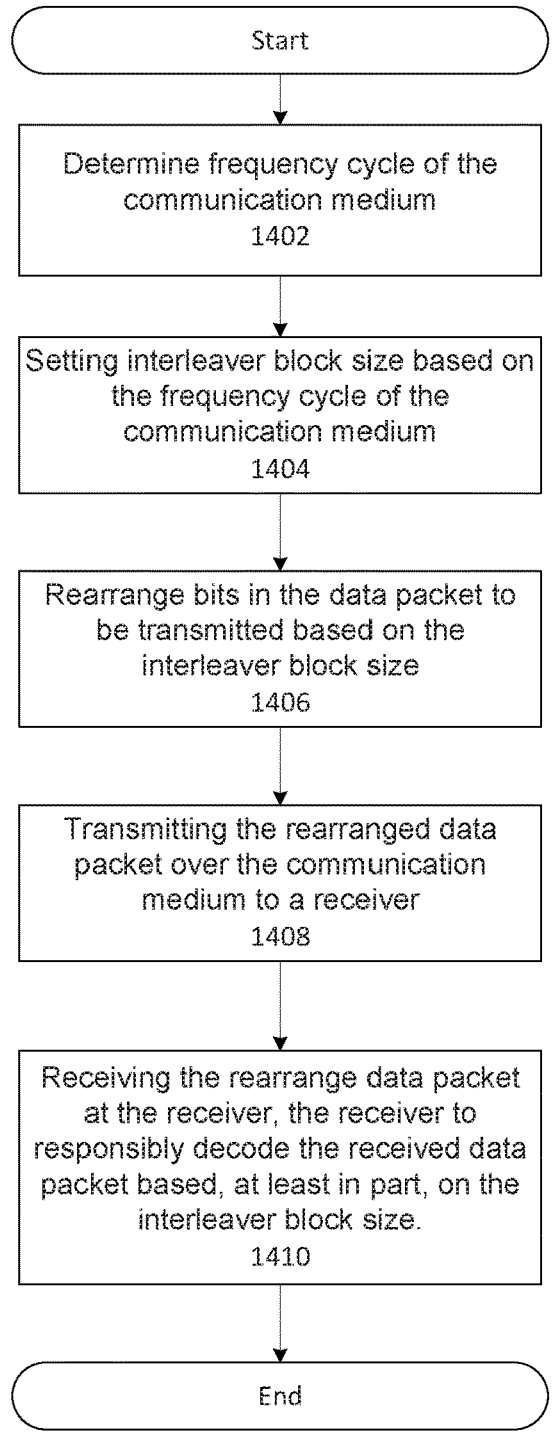
FIG. 14 is a block diagram illustrating a method for performing the interleaver error distribution in accordance with an embodiment.

FIG. 14 is a flow diagram illustrating an embodiment of data transmission utilizing interleaver error distribution over a communication medium subject to noise bursts. The use of interleaver error distribution is performed by a sending device which may be a modem, transceiver, etc., such as the sender 1310 of FIG. 13. In some embodiments, instructions are stored and executed by the receiving device to direct performance of one or more aspects of the interleaver error distribution. For example, these instructions may be part of a finite state machine. At 1402, the frequency cycle of the communication medium, on which the data is to be transmitted, is determined. The communication medium, according to some embodiments, is a low voltage power grid. In at least some of these embodiments, the low voltage power grid uses alternating current (AC) waveform operating at 50 Hz frequency. Other embodiments may comprise communication mediums utilizing waveforms of different types and frequencies such as an AC waveform at 60 Hz. The type and frequency disclosed here are intended only to illustrate and are in no way limiting. At 1404, the size of blocks used by the interleaver error distribution is set based on the determined frequency cycle of the communication medium. In some embodiments, the interleaver block size is set to one-half of the frequency cycle of the communication medium. At 1406, the bits in the data packet to be transmitted are re-arranged (i.e., interleaved) based on the interleaver block size, which was set based on the determined frequency cycle of the communication medium. At 1408, the re-arranged data packet is transmitted, by the sending device's (e.g., sender 1310) I/O module (e.g., I/O hardware 1318), over a communication medium (e.g., medium 1350) to the receiving device (e.g., receiver 1320). At 1410, the I/O module (e.g., I/O Hardware 1328) of receiving device receives the re-arranged data packet from the communication medium. According to an embodiment, the receiving device, via a decoder component (e.g., decoder 1324), decodes the received data packet based, at least in part, on the interleaver block size. In one embodiment, the decoding comprises reconstructing the original packet that was transmitted by the sending device using the data bits in the received data packet and the interleaver, then performing error correction on the reconstructed data packet.

Embodiments of the invention may include various steps as set forth above. The steps may be embodied in machine-executable instructions which cause a general-purpose or special-purpose processor to perform certain steps. Alternatively, these steps may be performed by specific hardware components that contain hardwired logic for performing the steps, or by any combination of programmed computer components and custom hardware components.

Elements of the present invention may also be provided as a machine-readable medium for storing the machine-executable program code. The machine-readable medium may include, but is not limited to, floppy diskettes, optical disks, CD-ROMs, and magneto-optical disks, ROMs, RAMs, EPROMs, EEPROMs, magnetic or optical cards, or other type of media/machine-readable medium suitable for storing electronic program code.

Throughout the foregoing description, for the purposes of explanation, numerous specific details were set forth in order to provide a thorough understanding of the invention. It will be apparent, however, to one skilled in the art that the invention may be practiced without some of these specific details. For example, it will be readily apparent to those of skill in the art that the functional modules and methods described herein may be implemented as software, hardware or any combination thereof.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A method for transmitting data over a communication medium using interleaver error distribution, the communication medium being a low voltage power grid, the method comprising:
   determining, by frequency detector circuitry, a frequency cycle of the communication medium;
   setting, by interleaver processor circuitry, an interleaver block size to one-half of the determined frequency cycle of the communication medium;
   rearranging, by encoder circuitry, bits in a data packet based on the interleaver block size; and
   transmitting, by input/output (I/O) circuitry, the re-arranged data packet over the communication medium to a receiver.

2. The method of claim 1, wherein the communication medium uses an alternating current (AC) waveform as a frequency of 50 Hz.

3. The method of claim 1, wherein the communication medium uses an alternating current (AC) waveform as a frequency of 60 Hz.

4. An apparatus comprising:
   frequency detector circuitry to detect a frequency cycle of a communication medium to which the apparatus is coupled to, the communication medium being a low voltage power grid;
   interleaver processor circuitry to set an interleaver block size to one-half of the detected frequency cycle of the communication medium;
   encoder circuitry to re-arrange bits in a data packet based on the interleaver block size; and
   input/output (I/O) circuitry to transmit the re-arranged data packet over the communication medium.

5. The apparatus of claim 4, wherein the communication medium uses an alternating current (AC) waveform as a frequency of 50 Hz.

6. The apparatus of claim 4, wherein the communication medium uses an alternating current (AC) waveform as a frequency of 60 Hz.

* * * * *